United States Patent
Bossu

(10) Patent No.: US 9,966,128 B1
(45) Date of Patent: May 8, 2018

(54) STORAGE STRUCTURE WITH NON-VOLATILE STORAGE CAPABILITY AND A METHOD OF OPERATING THE SAME

(71) Applicant: GLOBALFOUNDRIES Inc., Grand Cayman (KY)

(72) Inventor: Germain Bossu, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/463,394

(22) Filed: Mar. 20, 2017

(51) Int. Cl.
| G11C 14/00 | (2006.01) |
| G11C 11/22 | (2006.01) |
| G11C 5/06 | (2006.01) |
| G11C 5/14 | (2006.01) |

(52) U.S. Cl.
CPC .......... *G11C 11/2275* (2013.01); *G11C 5/063* (2013.01); *G11C 5/148* (2013.01); *G11C 11/221* (2013.01); *G11C 11/2273* (2013.01); *G11C 11/2297* (2013.01); *G11C 14/0072* (2013.01)

(58) Field of Classification Search
CPC ................................. G11C 14/0072
See application file for complete search history.

(56) References Cited

U.S. PATENT DOCUMENTS

| 6,141,237 A | * | 10/2000 | Eliason | G11C 11/22 365/145 |
| 2002/0066915 A1 | * | 6/2002 | Ford | B82Y 10/00 257/295 |
| 2007/0158731 A1 | * | 7/2007 | Bae | G11C 11/22 257/314 |
| 2008/0019162 A1 | * | 1/2008 | Ogura | G11C 11/412 365/72 |
| 2009/0147577 A1 | * | 6/2009 | Ivanov | G11C 14/00 365/185.07 |

* cited by examiner

*Primary Examiner* — Hoai V Ho
*Assistant Examiner* — Jay Radke
(74) *Attorney, Agent, or Firm* — Amerson Law Firm, PLLC

(57) ABSTRACT

The present disclosure provides a storage cell or storage structure having a static RAM-like operational behavior while nevertheless providing non-volatile storage capability on a single bit basis. To this end, a non-volatile storage element, such as a ferroelectric transistor element, may be provided within an inverter structure so as to allow the storage of a logic state at any desired operational phase by increasing the voltage difference used for operating the inverter structure. In illustrative embodiments, the stored logic state may be re-established during a power-up event.

18 Claims, 10 Drawing Sheets

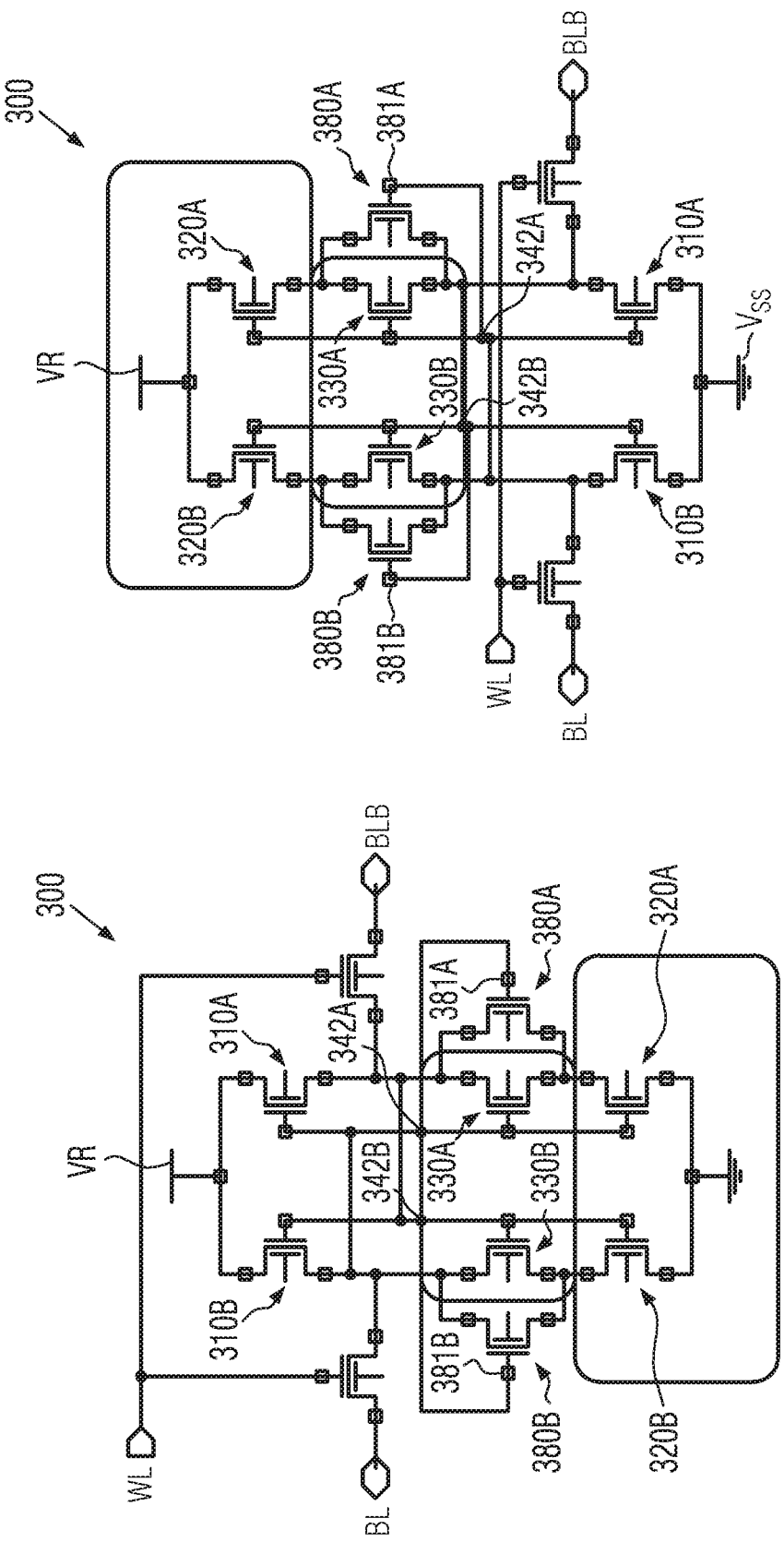

STORAGE STRUCTURE WITH NON-VOLATILE STORAGE CAPABILITY AND A METHOD OF OPERATING THE SAME

BACKGROUND

1. Field of the Disclosure

Generally, the present disclosure relates to electronic data storage techniques, in which a logic state of a storage structure is maintained after powering down the storage structure.

2. Description of the Related Art

In many technical systems that include electronic components, various different electronic data storage techniques have to be implemented in order to guarantee proper functioning of a respective technical system. For example, in many applications, different types of information have to be processed and therefore stored, which is typically accomplished on the basis of digital data. A base entity of information may be considered as an entity having the capability of taking on two different logic states. When implementing a respective logic state in hardware, an appropriate electronic configuration has to be provided that is capable of assuming two different electronic states. These different electronic states may be efficiently detected upon "reading" the respective logic state and may be readily changed in accordance with the underlying information bit by appropriately "writing" or "programming" the required logic state. To this end, a wide variety of electronic configurations, such as registers, storage cells and the like, are well known in the art, wherein each type of storage structure may exhibit specific operational advantages and disadvantages.

For example, if a large amount of data is to be temporarily stored in an electronic device, such as a computer, a microcontroller and the like, frequent access to the data may be required. If extremely high access speed is not of utmost priority, so-called dynamic memories may frequently be used, which may be efficiently implemented as integrated circuit areas requiring a single storage capacitor and one transistor for realizing a single bit of information. Due to the fact that the charge in the respective storage capacitors has to be periodically refreshed and due to the requirement of shifting a relatively high amount of charge upon "writing" or "programming" a respective storage capacitor, the achievable access speed is reduced compared to so-called static memory structures. In these static memory structures, a certain logic state may be determined by the conduction state of a circuit element, such as a transistor, and a change of the logic state is accomplished by changing the state of the circuit element, thereby providing access speeds that are basically determined by the switching time of the relevant circuit element. Consequently, in this case, a change of a logic state of a static memory cell may be changed in the order of magnitude of the switching time of respective transistor elements of a technology node under consideration. Although the above specified storage techniques may represent highly efficient techniques, which may be readily implemented in any type of integrated circuit, data storage is restricted to the times at which the device is supplied with power. After a power-down event, the data is lost.

Therefore, many non-volatile data storage techniques have been developed, such as mass storage systems on the basis of magnetic storage devices, optical storage techniques, which are typically provided as peripheral systems enabling the storage of a large amount of data, however, requiring relatively long access times. Therefore, significant efforts have been made in order to implement non-volatile storage techniques so as to complement or replace semiconductor-based storage structures. For example, flash memories may be used as non-volatile storage structures, in which appropriately designed capacitive structures that may be dynamically re-configured are used in a transistor configuration so as to specifically affect transistor characteristics, such as threshold voltage and the like. For example, charge carriers may be injected into or removed from a dielectric material in the vicinity of a transistor channel in order to control transistor performance on the basis of the charge carriers within the dielectric material. In this manner, the difference in transistor characteristics may be readily detected when operating the transistor and, therefore, the specific state of the capacitive configuration that reflects the desired logic state may be detected and thus "read out." On the other hand, by changing the capacitive configuration in the transistor element, a desired logic state may be stored therein, which is typically accomplished by establishing specific operating conditions in order to "program" the respective transistor. In this manner, a single transistor may suffice for storing a single bit of information, possibly requiring any additional circuitry for establishing the specific operational conditions upon programming the storage transistor. Although such storage transistors of flash-memory structures, in which charge may be trapped in or released from a specific portion of a gate electrode of the transistor, may present a very efficient solution for storing a single bit of information, it nevertheless turns out that, in particular, the ongoing scaling of advanced semiconductor devices may result in significant difficulties. That is, the further reducing of the overall gate dimensions of such storage transistors may require highly sophisticated techniques when forming respective gate electrode structures. Therefore, implementation of such floating gate-type storage transistors may result in significant challenges, thereby necessitating additional efforts and adding complexity to the manufacturing processes, which may finally translate into increased overall costs.

In other approaches, the ferroelectric effect has been exploited so as to provide circuit elements, such as resistors, transistors and the like, in which a ferroelectric material may be polarized in order to appropriately affect the operational behavior. The respective polarized state may then be considered as a respective logic state, which may, therefore, be written into or read out from a corresponding circuit element that includes this polarized ferroelectric material.

Although the concept of incorporating non-volatile storage elements, such as transistors, ferroelectric resistors and the like, may be considered a promising approach for imparting non-volatile storage capability to respective electronic circuits, such as registers, flip-flops, memory devices and the like, nevertheless significant efforts have to be made so as to implement a respective technology into existing semiconductor platforms and also provide the respective technical means that enable storing and/or reading out an information bit at specific stages of operation of a respective device, in particular, upon powering up a device so as to re-establish a desired overall state of the device.

In view of the situation described above, the present disclosure, therefore, relates to techniques in which a logic state or information bit may be stored in a non-volatile manner, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques according to which non-volatile data storage on a single bit base may be accomplished at a specific operating stage of a storage structure by using a non-volatile storage element in a circuit environment, which, in one operational phase, enables volatile write and read operations at a desired low latency and, in other operational stages of the device under consideration, non-volatile storage of an information bit may be accomplished. As a consequence, during specified operating conditions, the non-volatile storage capability may be exploited so as to store or establish a specific logic state substantially without compromising or affecting the "standard" read and write capabilities of the device. In illustrative embodiments, a static storage structure may be provided so as to enable highly efficient read and write operations in a volatile manner, i.e., in a static RAM-like manner, while the specific operating phase, such as power-down event, may then allow for storing a specific logic state in a non-volatile manner, which may then be used to re-establish the stored non-volatile logic state at a desired operational phase of the entire structure. In illustrative embodiments, the logic state of the storage structure may be re-established during a power-up event, thereby enabling continuation of the operation of the storage structure upon repowering the device without requiring an additional operating phase for specifically setting the storage structure to the desired logic state. In this manner, single bit storage capabilities of well-established electronic concepts may be efficiently combined with non-volatile storage capabilities that may specifically be provided at a desired operating phase of the storage structure under consideration.

One illustrative embodiment disclosed herein relates to a static storage cell, which includes a first inverter structure including a first transistor element and a non-volatile storage element, wherein the first inverter structure includes a first input and a first output. The static storage cell further includes a second transistor element connected in series between the non-volatile storage element and a reference voltage. Additionally, the static storage cell includes a second inverter structure having a second input and a second output, wherein the second output is connected to the first input and the second input is connected to the first output.

In a further illustrative embodiment of the present disclosure, a one-bit storage structure includes a first transistor element having a first gate terminal, a first drain terminal and a first source terminal, wherein the first source terminal is connected to a low supply voltage or a high supply voltage. The one-bit storage structure further includes a second transistor element having a second gate terminal, a second drain terminal and a second source terminal, wherein the second source terminal is connected to the other one of the low supply voltage or the high supply voltage. Additionally, the one-bit storage structure includes a non-volatile storage element having at least a first terminal and a second terminal, wherein the first terminal is connected to the first drain terminal of the first transistor element and the second terminal is connected to the second drain terminal of the second transistor element, and wherein the first terminal and the first drain terminal form an output node.

According to a still further illustrative embodiment of the present disclosure, a method is provided. The method includes providing a static storage cell so as to include a non-volatile storage element. The method further includes performing a power-up process by supplying a low supply power and a high supply power to the static storage cell. Additionally, the method includes, during the power-up process, establishing a logic state of the static storage cell at an output node thereof on the basis of a state of the non-volatile storage element.

BRIEF DESCRIPTION OF THE DRAWINGS

The disclosure may be understood by reference to the following description taken in conjunction with the accompanying drawings, in which like reference numerals identify like elements, and in which:

FIGS. 3E and 3F schematically illustrate circuit diagrams of the storage cells, similar to FIGS. 3C and 3D, however, with a different control scheme for the respective switching elements, according to illustrative embodiments;

Figure 1A:
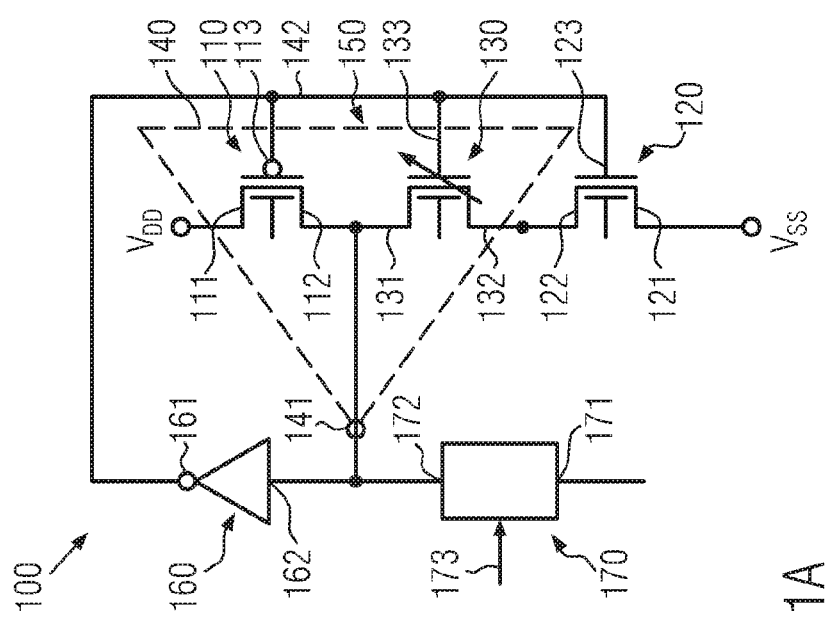
FIG. 1A schematically illustrates a circuit diagram of a static storage cell having non-volatile storage capability by using a one-bit storage structure formed on the basis of an N-channel type configuration of a non-volatile storage element, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is based on the concept that the functionality of standard single-bit storage structures, such as flip-flops, storage cells and the like, may be extended by incorporating a non-volatile storage element, in illustrative embodiments, a ferroelectric transistor element, in order to permanently store a specific logic state at a specific operational phase without undue electronic overhead. To this end, the non-volatile storage element is incorporated into the circuit structure so that a standard operation of a storage element, for instance, read and write operations, may be performed in a usual manner, for instance, in the form of a static memory cell, i.e., in a static RAM-like manner, while, on the other hand, at a specific well-defined operational phase, the momentary logic state may be entered into the non-volatile storage element. Consequently, the previously permanently stored logic state may be re-established at any specific time during operation of the storage structure. In illustrative embodiments, the specific point in time for re-establishing the stored logic state is represented by a power-up event so that further processing of the device may continue on the basis of the previously stored logic state.

In some illustrative embodiments, the specific point in time for permanently storing a logic state in the non-volatile storage element may correspond to a power-down sequence so that, in this case, the corresponding logic state may be restored upon powering-up the device without requiring any additional measures. In this manner, highly efficient electronic components may be provided, for instance, in the form of flip-flops, in which at least the last stage may be provided in the form of a stage having the non-volatile storage capability in order to restart the flip-flop in a desired logic state upon powering-up, which represents the state stored during the previous power-down event. Similarly, any state machine may have incorporated therein corresponding logic circuits with non-volatile storage capability in order to capture a specific logic state at any desired point in time during operation, for instance, upon a power-down event, and, during the next power-up event, the state machine may restore its previous operational state without requiring any extra additional storage capabilities and respective electronic overhead for re-implementing a desired initial state of the state machine upon powering-up. In this manner, the state machine may resume operation based on exactly the same state as was present during the powering-down of the state machine. Therefore, a "seamless" operation in the functional sense may be achieved, even when physically interrupting the operation of the state machine by one or more power-down/power-up sequences.

Similarly, any signal storage element, such as a latch, may be provided in the form of the structure having non-volatile storage capability, thereby also significantly extending overall functionality and performance of any such devices. Basically, the concept of the present disclosure may be applied to any situation in which logic states may have to be stored at a specific time of operation, irrespective of whether the logic state represents a single bit or one bit of a plurality of bits of a bit pattern in order to represent more complex information. If, for instance, any such information, for instance representing a sensor value and the like, may have to be stored at a certain point in time and may have to be re-established in a later time, for instance, upon powering-up a remote device, the concept of the present disclosure may be readily implemented in a corresponding circuit concept while reducing the number of additional electronic components, since, in some illustrative embodiments, the non-volatile storage of a single bit of information may be accomplished on the basis of the non-volatile storage element, for instance in the form of a ferroelectric transistor element, possibly in combination with a very restricted number of additional transistor elements, wherein a specific difference of the high and low supply voltages may suffice for initiating the storage of the momentary logic state in the non-volatile storage element. Consequently, due to the significantly reduced electronic overhead compared to conventional approaches for permanently storing a logic state in a non-volatile storage element, the concept of the present disclosure may be applied to any electronic technique that requires a permanent or non-volatile data storage at specific operational stages in order to perform a later re-start on the basis of the previously stored information.

FIG. 1A schematically illustrates a circuit diagram representing a storage cell 100, which may be considered as a static storage cell, since a respective logic state or bit of information may be processed on the basis of the operational status of transistor elements, thereby enabling read and write operations at rates that correspond to the switching times of the corresponding transistor elements, as in a typical operational mode of static memory cells. In addition to this "static" operational behavior, the storage cell 100 may also provide non-volatile storage capabilities at specific operational phases, as will be described later on in more detail.

The storage cell 100 may comprise a storage structure, also referred to as one-bit storage structure, 150, which may comprise a first transistor element 110, a second transistor element 120 and a non-volatile storage element 130. The first transistor element 110 may comprise a source terminal 111 connected to a supply voltage line, which may represent the high supply voltage line $V_{DD}$, when the first transistor element 110 represents a P-channel transistor. Furthermore, the transistor element 110 may comprise a drain terminal 112 and a gate terminal 113. Similarly, the second transistor element 120, representing in the embodiment shown an N-channel transistor, may comprise a source terminal 121 connected to the low supply voltage $V_{SS}$, a drain terminal 122 and a gate terminal 123. Furthermore, the non-volatile storage element 130 may comprise a first terminal 131, a second terminal 132 connected in series between the drain terminal 112 and the drain terminal 122 of the first and second transistor elements 110, 120, respectively. Furthermore, the non-volatile storage element 130 may comprise a control terminal 133, which may be connected to the respective gate terminals 113, 123 of the first and second transistor elements 110, 120, respectively.

It should be appreciated that the first transistor element 110 and the non-volatile storage element 130 may be considered as an inverter structure 140, whose output may be represented by a node formed between the drain terminal 112 and the first terminal 131 and whose input may be considered as the node formed by the connection of the gate terminal 113 and the control input 133. From this point of view, the storage cell 100 may therefore comprise the inverter structure 140, which may be connected in series to the second transistor element 120. The transistor element 120 may therefore enable connection and disconnection of the inverter structure 140 to and from the low supply voltage $V_{SS}$.

It should be appreciated that the non-volatile storage element 130 may be provided on the basis of any low-voltage storage element, i.e., a circuit element operating in the range of approximately 1-10 V, provided on the concept of any technique that allows non-volatile storage of a logic state, as already discussed above. In illustrative embodiments, the non-volatile storage element 130 may be formed on the concept of a ferroelectric component, such as a capacitive structure, in which the capacitor dielectric material may include a ferroelectric component so as to enable a controlled adjustment of the electoral static behavior of the capacitive structure. In other cases, the conductivity of a resistive structure may be adjusted on the basis of a ferroelectric material and the like in order to obtain different conductivity behaviors in order to represent different logic states. It should be appreciated that in any such cases at least one additional transistor may be provided in combination with a corresponding non-volatile structure in order to enable controlled read and write operations of the non-volatile structure. Thus, also in these cases basically the non-volatile storage element 130 may comprise the first and second terminals for enabling a current flow therethrough in accordance with the operational conditions of the remaining components of the storage cell 100, while the control terminal 133 may provide the ability of controlling the state of a storage medium in the element 130, such as a ferroelectric material, and the like.

In still other illustrative embodiments, as will be described in more detail later on, the non-volatile storage element 130 may be provided in the form of a ferroelectric transistor element, in which a ferroelectric material may be provided in combination with the gate dielectric material so as to enable non-volatile adjustment of basic transistor characteristics, such as the threshold voltage of the transistor. The threshold voltage of a transistor may be considered as a minimum voltage required for inducing a conductive path between the source and the drain terminals of the respective transistor element, when considering an enrichment type transistor. When providing the non-volatile storage element 130 as a ferroelectric transistor element, the first terminal 131 may represent the drain terminal, the second terminal 132 may represent the source terminal and the control terminal 133 may represent the gate terminal, wherein, in the embodiment shown, the storage element 130 may represent an N-channel type ferroelectric transistor.

The storage cell 100 may further comprise a further inverter structure 160 having an input 162 connected to the output 141 of the inverter structure 140, wherein, as previously discussed, the output 141 may correspond to a node of the connection of the drain terminal 112 of the first transistor element 110 and the first terminal 131 of the non-volatile storage element 130. Moreover, the inverter structure 160 may comprise an output 161 connected to the input 142 of the inverter structure 140, i.e., to a node corresponding to the connection of the gate terminals 113, 123 and the control terminal 133. Thus, the series connection of the first transistor 110 and the non-volatile storage element 130, i.e., the inverter structure 140, and the inverter structure 160 form a feedback circuit, thereby forming an electronic gate for storing a respective logic state, as will be discussed later on. It should be appreciated that, in particular, the second transistor 120 may connect the non-volatile storage element 130 to the low supply voltage $V_{SS}$ and may also disconnect the non-volatile storage element 130 from the low supply voltage depending on the specific operational status of the storage cell 100. For example, if any desired logic state is applied to the input 162 of the inverter 160, this logic state will be reliably maintained, even if the initial signal provided at the input 162 is removed, thereby providing the storage of the desired logic state. Similarly, the inverted logic state is reliably maintained at the input 142 of the inverter structure 140. Due to the feedback configuration, it should be appreciated that also the input 142 may be considered as an input for applying a respective input signal for forcing the storage cell 100 into a desired logic state.

In order to enter a desired logic state into the storage cell 100 and also for reading out a stored logic state from the storage cell 100, an appropriate component may be provided, which may be referred to herein as a pass gate and which is generally indicated as pass gate 170. Typically, the pass gate 170 may comprise a first data terminal 171 and a second data terminal 172 and a control terminal 173. For example, upon "writing" a specific logic state into the storage cell 100, a specific signal may be applied at the terminal 171 in combination with a control signal at the terminal 173 so as to set the pass gate 170 into a condition for passing the signal through the gate 170 and being provided at the terminal 172 and a thus at the input 162 of the inverter structure 160. Upon writing a data bit into the storage cell 100, it is assumed that the current drive capability of the pass gate 170 and any upstream circuitry is sufficiently high so as to force the input 162 and thus the output 141 into the respective logic state entered into the pass gate 170. Consequently, a desired logic state, a logic high or a logic low, will be forced at the input 162 and will then be maintained when the initial signal is removed, for instance, by respectively removing the control signal at the terminal 173. Upon reading the state of the storage cell 100, it is assumed that in this case the upstream circuitry connected to the pass gate 170 upon performing a read operation is of sufficient high-ohmic nature in order to avoid substantial influence on the state of the output 141.

Consequently, the storage cell 100 is appropriately configured so as to enable read and write operations similar to standard static memory cells, registers and the like.

During operation of the storage cell 100, the standard operation, i.e., the volatile write and read operations, may be performed as discussed above in the context of explaining the function of the pass gate 170. Consequently, during any operational phase, on the basis of a desired supply voltage difference of, for example, 1-3 V, the storage cell 100 may operate in accordance with the operational behavior of well-established static memory cells. At a specific point during the operation of the storage cell 100, it may be desired to store the momentary logic state of the cell 100 in a non-volatile manner by using the non-volatile storage element 130. In this case, the voltage at the control terminal 133 may be set to an appropriate level with respect to the voltage at the first and/or second terminals 131, 132 in order to reconfigure the storage element 130, for instance, by adjusting a specific polarization of a ferroelectric material and the like. For example, it may be assumed that a specific electric field and thus voltage difference between the control terminal 133 and the terminals 131, 132 is required for appropriately configuring the storage element 130, wherein the required write voltage difference may, for instance, exceed the voltage difference used during the standard operation. In this case, the high supply voltage $V_{DD}$ may be raised or the low supply voltage $V_{SS}$ may be lowered so as to obtain the required write voltage at the control input 133. This voltage, i.e., the voltage difference between the raised $V_{DD}$ and $V_{SS}$, is obtained, in the embodiment shown, as an output signal from the inverter 160.

For example, when a high-voltage state at the input 162 is to be stored in a non-volatile manner, the output 161 provides a low voltage level, thereby also providing the low voltage at the input 142 and thus at the gate terminals 113, 123 of the first and second transistor elements 110, 120, respectively, and also at the control terminal 133. On the other hand, the output 141 and thus the drain terminal 112 and the first terminal 131 are at high voltage, i.e., the raised $V_{DD}$ corresponding to the write voltage, thereby creating a desired high voltage and thus electric field between the terminal 131 and the control terminal 133, wherein, as discussed above, this voltages difference or electric field may be sufficiently high so as to modify the storage state of the element 130 in a non-volatile manner, for instance, by appropriately polarizing a ferroelectric material and the like. On the other hand, the second transistor 120 is in the off-state so that the second terminal 132 of the non-volatile storage element 130 is "cut-off" from the low supply voltage $V_{SS}$ due to the low gate voltage at the gate terminal 123. Consequently, due to the "floating" nature of the terminal 132, substantially similar electric field conditions may prevail across the entire storage element 130, thereby allowing a reliable modification of the storage medium included therein. In other cases, as will be discussed in more detail with reference to FIG. 1C, additional measures may be taken so as to more efficiently equalize the voltage across the first and second terminals 131, 132 of the element 130.

When, on the other hand, a low voltage state at the input 162 needs to be stored in a non-volatile manner, the output voltage at the output 161 is high and therefore a high voltage is applied to the control input 133, while, on the other hand, the voltage at the terminal 132 is at the low supply voltage $V_{SS}$, since the second transistor 120 is in its conducting state due to the high voltage at its gate terminal 123. Again, it should be appreciated that, in this stage, the difference between the supply voltages is set so as to comply with the programming or write requirements of the storage element 130. Consequently, a sufficiently high voltage difference is obtained between the terminal 132 and the terminal 133 so as to appropriately configure the storage medium of the element 130, as discussed above. Also in this case, if required, superior voltage equalization between the terminals 132, 131 may be accomplished on the basis of an additional switching element, while, in other cases, the storage element 130 may be configured as a transistor element, which may be in the conductive state when provided as an N-channel type transistor, thereby substantially holding the voltages at the terminals 131, 132 at the same level.

Consequently, by setting, i.e., increasing, the voltage difference between the supply voltages $V_{DD}$, $V_{SS}$ to a value as required for permanently reconfiguring the storage element 130, a respective logic state may be stored in a non-volatile manner. On the other hand, by reducing the difference of the supply voltages, the standard operational range may be entered, as discussed above, thereby enabling read and write operations of the storage cell 100 substantially without being affected by the non-volatile state of the element 130. In some illustrative embodiments, the corresponding adjustment of the difference of the supply voltages for using a write operation, i.e., storing a high logic state or a low logic state, in the storage element 130 may be caused during a power-down event so that the very last logic state at the input 162 may be programmed or written into the storage element 132 in a non-volatile manner prior to actually finally switching off the high supply voltage.

For example, the non-volatile storage element 130 may have a first state, in which, for a given control voltage at the terminal 133, the current drive capability is relatively low compared to the current drive capability of, for instance, the second transistor element 120 at the same level of control voltage. In this case, during a power-up event, a substantially non-conductive state may be maintained throughout the increase of the supply voltage difference, even if, for some reason, the N-channel transistors in the storage cell 100, for instance in the inverter 160 and the second transistor element 120, would be initialized with their conductive states. In this case, the logic state stored in the storage element 130 will result in a high-voltage state at the output 141 irrespective of any initial state of the transistors in other circuit components. On the other hand, when the storage element 130 is in a state in which a highly conductive state is established between the terminals 131 and 132 even for a low voltage state of the control terminal 133, for instance at or near $V_{SS}$, a low-voltage state would be maintained at the output 141, even if, for some reason, the P-channel transistors would be initialized in their conductive states, since, in this case, it may be assumed, without restricting the application to following explanation, that the output 141 may remain at a relatively low voltage for a longer time period due to the additional free charge carriers in the storage element 130 compared to the inverter structure 160. In this case, a reliable low-voltage state may be maintained at the output 141 upon ramping up the supply voltage, since then the imbalance in the ramp-up speeds of the inverter structure 140 and the inverter structure 160 may reliably result in a low-voltage state, which may thus represent the initial logic states of the storage cell 100 after having completed the power-up sequence. On the other hand, when for any reason the N-channel transistors would be initialized into the conductive states, the storage element 130 would already be in its conductive state, thereby reliably pulling down the output 141. As a result, during the power-up process, the logic state stored in a non-volatile manner in the storage element 130 may be reliably restored.

Although FIG. 1A shows the transmission gate 170 on terminal 162, in other cases, the transmission gate 170 may be on terminal 161 or both. Hence, it should be appreciated that one transmission gate, i.e., a bidirectional input/output, such as gate 170, must be able to drive at least one of the terminals 161 or 162 for write. Furthermore, in further illustrative embodiments, additional output stages, such as regular inverters or tri-state inverters, may be added to the terminals 161 and/or 162.

Figure 1B:
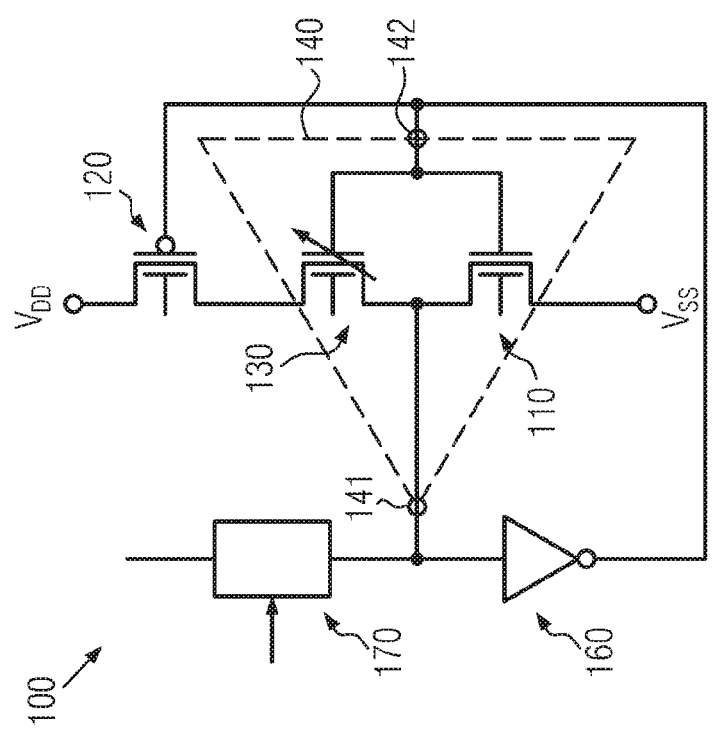
FIG. 1B schematically illustrates a circuit diagram of a static storage cell having non-volatile storage capability based on a P-channel type configuration of a non-volatile storage element, according to illustrative embodiments.

FIG. 1B schematically illustrates a circuit diagram of the storage cell 100 according to further illustrative embodiments, in which an inverse conductivity regime may be used for the various circuit elements. As shown, the first transistor element 110 may be provided in the form of an N-channel transistor element connected to the low supply voltage $V_{SS}$ and forming, together with the storage element 130, the inverter structure 140. In this case the storage element 130 may be provided in combination with a P-channel transistor or may be provided in the form of a P-channel transistor. Moreover, the second transistor element 120 may be provided in the form of a P-channel transistor for connecting and disconnecting the non-volatile storage element 130 to and from the reference voltage, which in this case may be represented by the high supply voltage $V_{DD}$. Similarly, the inverter structure 160 may provide feedback, since its output is connected with the input 142 and its input is connected to the output 141 of the inverter structure 140. Furthermore, the pass gate 170 may be provided so as to have a configuration as discussed above and may thus ensure compatibility with write and read operations to be performed with the storage cell 100.

It should be appreciated that, with respect to the functional behavior of the storage cell 100 of FIG. 1B, the same criteria may apply as previously discussed with respect to the storage cell 100 as shown in FIG. 1A, except for the inverse polarity of the respective circuit elements and the supply voltages.

Figure 1C:
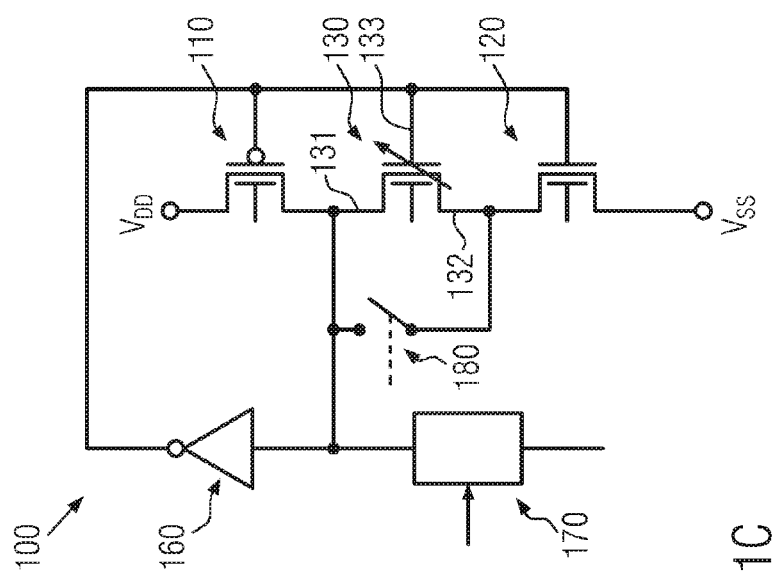
FIG. 1C schematically illustrates a circuit diagram of the static storage cell, wherein the non-volatile storage element may be bridged by a switching element in at least some operating stages according to illustrative embodiments.

FIG. 1C schematically illustrates a circuit diagram of the storage cell 100, which may have basically the same configuration as the storage cell 100 of FIG. 1A, wherein additionally a switching element 180 may be provided so as to connect the first and second terminals 131, 132 of the non-volatile storage element 130 in a controlled manner during specific operational phases. It should be appreciated that also in FIG. 1C an "N-channel" configuration is illustrated, in which the storage element 130 and the second transistor 120 may be formed of or include N-channel transistor elements, while the first transistor element 110 may be provided in the form of a P-channel transistor. In other cases, the switching element 180 may also be provided across the respective terminals of the storage element 130 as illustrated in FIG. 1B, in which the element 130 and the second transistor element 120 are provided on the basis of P-channel transistors. The switching element 180 may have the configuration of any appropriate circuit architecture, for instance, based on one or more transistor elements, wherein a respective control signal for opening or closing the switching element 180 may be provided at a respective gate terminal.

As a consequence, upon "writing" or "programming" a desired logic state into the non-volatile storage element 130, in particular in a state wherein a high voltage is required at the terminals 131, 132 and a low voltage is required at the control terminal 133, which may basically result in a non-conductive state between the terminals 131, 132 when considering a transistor element representing the storage element 130 or representing at least a part thereof, the closed state of the switching element 180 may provide superior programming conditions by "shorting" the first and second terminals 131, 132. Consequently, the corresponding reconfiguration of the storage medium, for instance, a ferroelectric material, may be accomplished under superior conditions, since substantially the same potential is present at each of the terminals 131, 132. As a consequence, the desired write operation may be performed in a highly reliable manner. It should be appreciated that the closed state of the switching element 180 in a write operation requiring a high voltage at the control terminal 133 and a low voltage at the terminals 131, 132 may not necessarily be required, since in this case the storage element 130 may be in a highly conductive state, thereby ensuring that substantially the same potential is present at the terminals 131, 132.

Figure 2A:
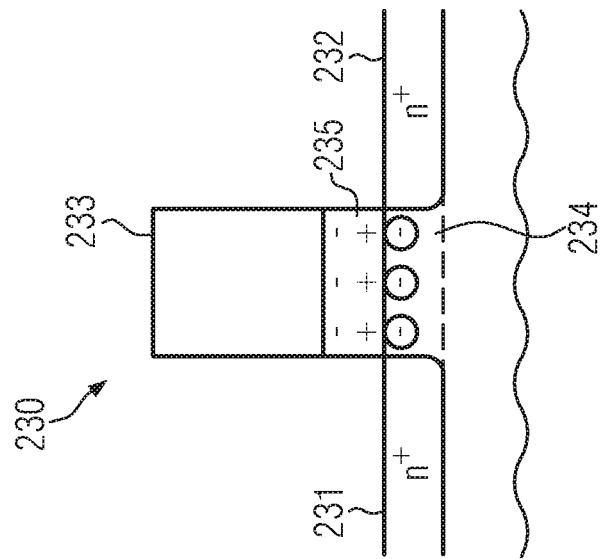
FIGS. 2A and 2B schematically illustrate cross-sectional views of a non-volatile storage element in the form of a ferroelectric transistor in two different states, according to illustrative embodiments.

FIG. 2A schematically illustrates a cross-sectional view of a non-volatile storage element 230, which may be provided in the form of a ferroelectric transistor element. The storage element 230 may thus comprise a gate electrode structure 233, which may receive a respective control voltage or gate voltage so as to adjust the operational behavior of the element 230. That is, a respective voltage applied at the gate electrode structure 233 may affect and thus control the conductivity of a channel region 234 provided between a drain region 231 and a source region 232, which may, therefore, represent respective first and second terminals of the element 230, as for instance also discussed above with reference to FIGS. 1A-1C. In the example shown, the element 230 may be provided in the form of an N-channel transistor so that the drain and source regions 231, 232 may represent highly N-doped semiconductor regions. Moreover, the drain and source regions 231, 232 may be embedded in a body region 236, if a "bulk" transistor architecture is considered. For example, the body region 236 may represent a P-doped semiconductor material. In other illustrative embodiments, the element 230 may be provided in the form of an SOI (silicon- or semiconductor-on-insulator) configuration, wherein, in particular, a fully depleted configuration of the channel region 234 may be achieved on and above an insulating layer, such as a silicon dioxide layer, as schematically indicated by 237. Also, in this case, the drain and source regions 231, 232 may be vertically bordered by the buried insulating layer 237. Moreover, a ferroelectric material 235 may be provided above the channel region 234, possibly in combination with an additional dielectric material (not shown), so as to reliably insulate the gate electrode material from the channel region 234. The ferroelectric material 235 may be provided in the form of any appropriate material composition, such as silicon doped hafnium oxide and the like, which may typically be selected in view of material characteristics and compatibility with processes and materials used for forming the element 230 and other transistor elements in a corresponding semiconductor device. It should further be appreciated that the cross-sectional view of FIG. 2A is intended to represent functional components in a very schematic manner, wherein actual architectural characteristics and the like are omitted so as to not unduly obscure the principles of a ferroelectric transistor element.

By applying an appropriate voltage between the gate electrode 233 on the one hand and the drain and source regions 231, 232 on the other hand, for instance for a fully depleted SOI device, the polarization of the ferroelectric material may be appropriately adjusted. As shown, the polarization may be adjusted by applying an appropriate negative voltage at the gate electrode 233 with respect to the drain and source regions 231, 232, thereby resulting in a repulsion of negative charge carriers in the channel region 234. Consequently, upon further operating the element 230 with a gate voltage that is below the voltage required for changing the polarization of the material 235, the element 230 may exhibit a relatively high threshold voltage, since a moderately high voltage is then required for establishing a conductive channel between the drain and source regions 231, 232.

Figure 2B:
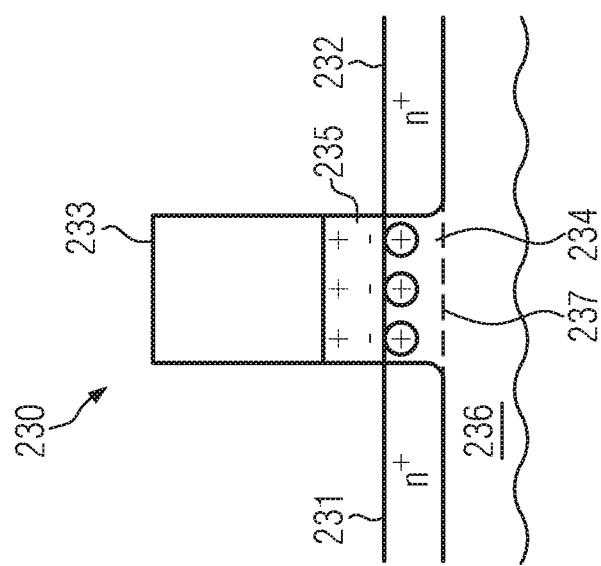

FIG. 2B schematically illustrates the storage element 230 in a state in which the material 235 has a polarization that is inverse to the polarization as shown in FIG. 2A. This may be accomplished by applying a moderately high voltage between the gate electrode 233 and the drain and source regions 231, 232, which may, therefore, result in an "accumulation" of majority charge carriers, i.e., in this case, negative charge carriers, thereby significantly reducing the threshold voltage of the element 230, since a conductive channel may be formed in the channel region 234 at low or even negative gate voltages.

Figure 2D:
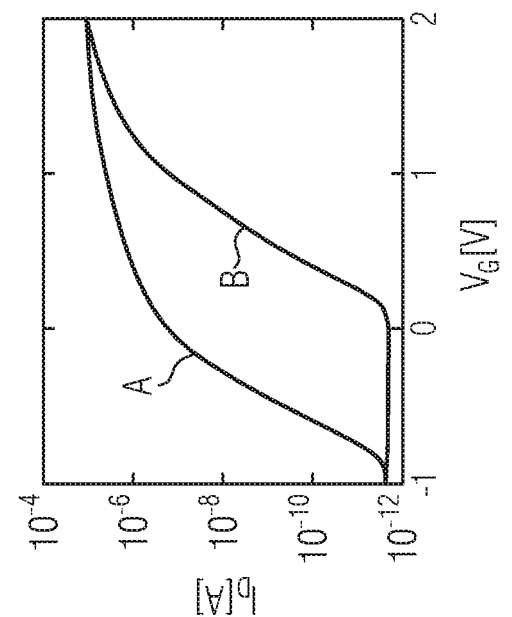
FIGS. 2C and 2D schematically illustrate respective graphs for illustrating a change of threshold voltage of a ferroelectric transistor in the two different stages and a graph of a difference in transistor characteristics, for instance in the form of transistor current, in the two different states, according to illustrative embodiments.
Figure 2C:
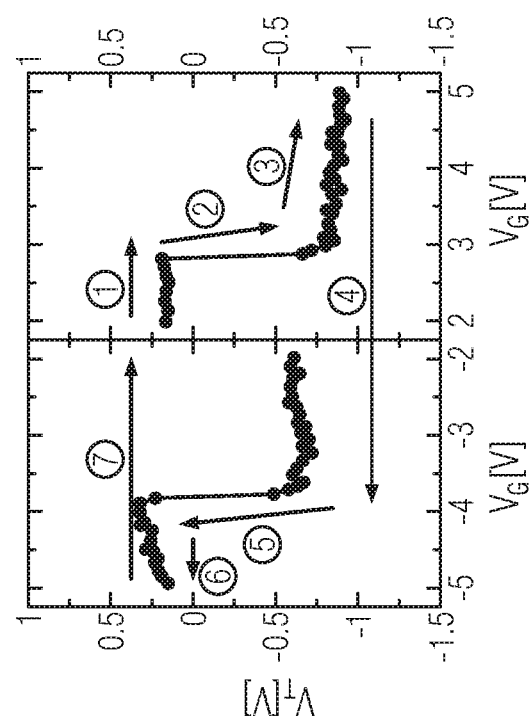

FIG. 2C illustrates measured values when operating a ferroelectric transistor element in a cyclic manner, such as the non-volatile storage element 230 as schematically illustrated in FIGS. 2A and 2B. For example, at an initial state, it may be assumed that the element 230 has a moderately high threshold voltage, which may correspond to a polarization state of the material 235 as shown in FIG. 2A. As indicated by 1 at the right-hand side of FIG. 2C, the gate voltage may be increased so as to finally reach the "write" voltage, which may, therefore, result in a re-polarization of the material 235, as, for instance, shown in FIG. 2B. Consequently, as indicated by 2 at the right-hand side of FIG. 2C, the threshold voltage is immediately reduced, for instance, even to a negative value. As indicated by 3, a further increase of the gate voltage may not have any significant effect on the resulting threshold voltage, since most of the molecules of the material 235 may have already been polarized in the manner as illustrated in FIG. 2B. When reducing the gate voltage, as indicated by 4, the polarization state of the material 235 may not change and, as indicated in the left-hand side of FIG. 2C, operation of the device 230 in a gate voltage range of approximately +2.5 V-3 V corresponds to an operation of a transistor element having the very low threshold voltage as indicated. Upon further reducing the gate voltage, as indicated at 5 at the left-hand side of FIG. 2C, the polarization state of the material 235 may be changed, as indicated in FIG. 2A, thereby establishing or re-establishing the moderately high threshold voltage. Consequently, upon operating the device in a voltage range of approximately −3 V to +2.5 V, as indicated by 7 in the left-hand side of FIG. 2C, the transistor element 230 will behave as a transistor having a high threshold voltage.

FIG. 2D schematically illustrates the respective drive current capability of the transistor element at the two different states, i.e., with low threshold voltage, represented by curve A, and high threshold voltage, represented by curve B. For example, as is evident for a gate voltage of 0 V, the low threshold voltage state will result in a moderately high drive current, while the respective current is significantly less, by several orders of magnitude, for the high threshold voltage device. Even for a gate voltage of 1 V, a significant difference in drive current may be obtained, thereby still allowing the detection of the two different transistor states on the basis of the very different drive currents.

Consequently, a ferroelectric transistor element may be efficiently used as a non-volatile low voltage storage element, wherein, in illustrative embodiments, an SOI configuration or a fully depleted SOI configuration may be implemented, thereby potentially not requiring a specific handling of semiconductor areas, i.e., body regions, provided below a respective buried insulating layer. On the other hand, for a bulk configuration, i.e., a configuration including the body region 236 (see FIG. 2A), for an efficient response of the ferroelectric material to respective gate voltages, it is advantageous to implement measures for electrically connecting the body region 236 to the drain and source regions 231, 232 during the respective write operation.

Ferroelectric transistor elements, such as schematically illustrated in FIGS. 2A and 2B, may be efficiently implemented in semiconductor devices formed on the basis of sophisticated transistor elements, as will be described later on in more detail with reference to FIG. 4.

It is to be noted that a P-channel configuration may be used as well, wherein reversed dopings and inverted voltages may be used compared to the regime as shown in FIGS. 2a and 2B.

Figures 3A, 3B:
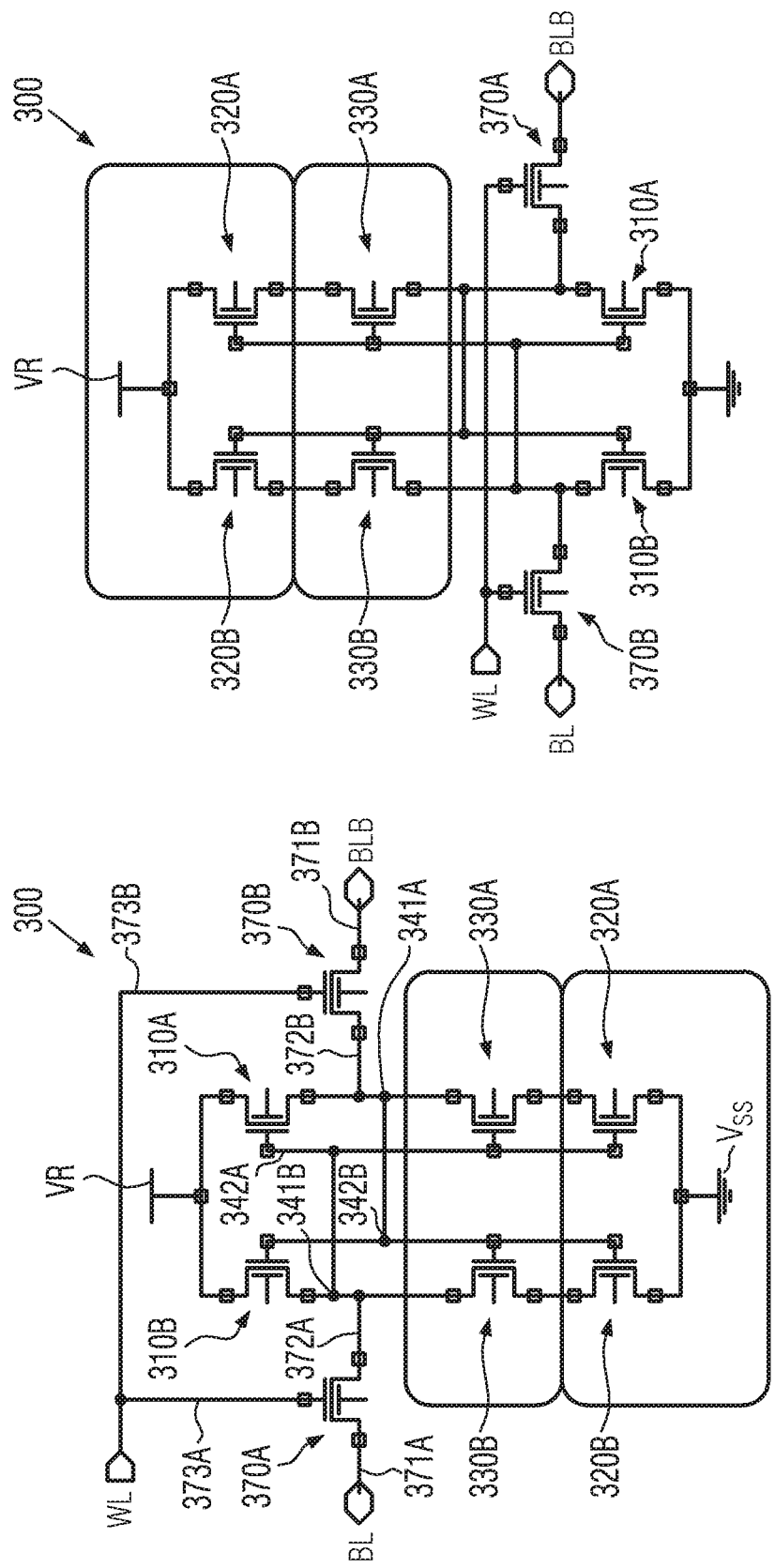
FIGS. 3A and 3B schematically illustrate circuit diagrams of a storage cell including non-volatile storage elements in N-channel configuration and P-channel configuration, respectively, according to illustrative embodiments.

FIG. 3A schematically illustrates a circuit diagram of a storage cell 300 according to further illustrative embodiments. As illustrated, the storage cell 300 may comprise two one-bit storage structures having a configuration, as also discussed with reference to FIG. 1A, wherein these two storage structures are cross-coupled with each other, thereby forming a storage cell of enhanced reliability for representing a logic state and its inverse counterpart at the same time. As shown, a first transistor 310A and a corresponding non-volatile storage element 330A form an inverter structure, as already discussed above. In combination with a second transistor element 320A, connection and disconnection of the storage element 330A to and from a reference potential, i.e., in this case, the low supply voltage $V_{SS}$, may be accomplished. Similarly, a first transistor of the second one-bit storage structure may comprise a first transistor 310B connected in series to a non-volatile storage element 330B, thereby also forming a respective inverter structure, which may be connected to and disconnected from the low supply voltage $V_{SS}$ by a second transistor element 320B. It should be appreciated that the configuration shown represents an "N-channel" configuration, since the non-volatile storage elements 330A, 330B may be formed of or may include an N-channel transistor configuration, as already discussed above with reference to FIG. 1A and with reference to FIGS. 2A-2D.

As a consequence, the inverter structures represented by the first transistor elements 310A, 310B and the non-volatile storage elements 330A, 330B, in combination with the respective second transistors 320A, 320B for connecting and disconnecting the respective inverter structures, are cross-coupled by connecting an output node 341A of the first inverter structure formed by the first transistor element 310A and the non-volatile storage element 330A with an input node 342B of the second inverter structure formed by the first transistor element 310B and the respective non-volatile storage element 330B. Similarly, an output node 341B of the inverter structure formed by the transistor element 310B and the storage element 330B is connected to an input node 342A of the inverter structure formed of the transistor element 310A and the storage element 330A.

It should be appreciated that the respective gate terminals of the elements 310A, 330A, 320A are connected with each other so as to form the input node 342A. Similarly, the gate terminals of the elements 310B, 330B, 320B are connected with each other, thereby forming the input node 342B. On the other hand, the output node 341A is formed between the transistor element 310A and the storage element 330A and similarly the output node 341B is provided between a connection of the transistor element 310B and the storage element 330B. It should further be noted that a configuration of drain and source terminals of the transistor elements 310A, 310B, 320A, 320B may be equivalent to the corresponding configurations as discussed in detail with reference to FIG. 1A. Similarly, the configurations of terminals of the storage elements 330A, 330B connected to the respective drain terminals of the transistors 310A, 320A, on the one hand, and the transistor elements 310B and 320B, on the other hand, may be analogous to the configuration as also described with reference to FIG. 1A.

Furthermore, the storage cell 300 may comprise a first pass gate 370A connected with one terminal 372A thereof to the output node 341B and receiving on its input terminal 371A a read or write signal. Moreover, a control terminal 373A may be connected to a signal source for enabling or disabling the pass gate 370A. Similarly, a second pass gate 370B may be provided so as to connect with one terminal 372B thereof to the output node 341A and to receive at an input terminal 371B thereof a read or write signal that is inverse to the read or write signal provided at the pass gate 370A. Moreover, a control terminal 373B may be connected to the control terminal 373A of the pass gate 370A. In the embodiment shown in FIG. 3A, the pass gates 370A, 370B are provided in the form of N-channel transistors, however, in other embodiments any other circuit configuration may be used in order to perform read and write operations with the storage cell 300. In particular, it should be appreciated that, with respect to the current drive capability of the pass gates 370A, 370B and respective upstream read and write circuitry, the same criteria apply as also previously discussed in the context of the pass gate 170 of FIG. 1A.

Upon operating the storage cell 300 on the basis of $V_{SS}$ and a high supply voltage VR that is selected to avoid a reconfiguration of the non-volatile storage elements 330A, 330B, a logic state and its inverse logic state may be written to and read out from the storage cell 300 in a similar manner, as already discussed in the context of FIG. 1A. For example, during a write operation, a logic signal may be supplied at the input 371A and an inverted input signal may be provided at the terminal 371B. Upon applying a high voltage control signal at the terminals 373A, 373B, these signals may be supplied to the respective nodes 341B, 342A on the one hand and to the nodes 341A, 342B on the other hand, respectively, thereby forcing a respective state and its inverse state into the storage cell 300 due to the high current drive capabilities of the pass gates 370A, 370B and any upstream circuit components. Upon removing the control signals at the terminals 373A, 373B, the respective logic state and its inverse state are maintained and may be read out at any appropriate point in time upon operating the respective pass gates 370A, 370B and respective read circuitry (not shown), as also discussed above in the context of FIG. 1A.

When requiring non-volatile storage of a specific logic state and its inverse counterpart state, the voltage VR may be increased so as to increase the voltage difference between the high supply voltage VR and the low supply voltage $V_{SS}$. For example, the voltage difference may be increased to approximately 4-5 V in order to respectively reconfigure the corresponding storage elements 330A, 330B. In this manner, the momentary logic state at the output node 341A is translated into a corresponding non-volatile storage state of the element 330A, while the inverse counterpart state at the output node 341B is taken over into the storage element 330B. Consequently, the storage elements 330A, 330B may have inverse states of their respective storage media, for instance, provided in the form of a ferroelectric material, as also discussed in the context of FIGS. 2A-2B. It should be appreciated that the mechanism for converting the respective logic state at the output nodes 341A, 341B into the corresponding storage elements 330A, 330B, respectively, may be accomplished in a similar manner, as discussed above, thereby requiring a corresponding increase of the voltage difference between VR and $V_{SS}$, which may, therefore, be accomplished by changing the voltage on a single supply voltage node. As also discussed above, a corresponding non-volatile storage event may be initialized at any point in time during operation of a device that includes the storage cell 300, wherein, in illustrative embodiments, a corresponding increase of the voltage difference may be initiated during a power-down sequence, thereby storing the very last logical state of the storage cell 300 in a non-volatile manner.

Moreover, upon a power-up event, the logical state and its complementary state may be re-established, as also discussed above, thereby restoring the very last logical state of the storage cell 300 without requiring any additional measures. In particular, the cross-coupling of the respective storage structures, i.e., the transistor elements 310A, 320A and the storage element 330A on the one hand and the transistor elements 310B, 320B and the storage element 330B on the other hand, also provides a high degree of robustness and reliability in translating the corresponding non-volatile storage state of the respective storage elements 330A, 330B into the appropriate states at the output nodes 341A, 341B, as discussed above. For example, if the storage elements 330A, 330B may be provided in the form of a ferroelectric transistor element in an N-channel configuration, as, for instance, discussed in the context of FIGS. 2A-2B, the low threshold voltage state of one device, for instance, the storage element 330A, and the complementary threshold voltage state of the other storage element, i.e., the element 330B, will reliably result in establishing a high voltage state at the node 341A and a low voltage state at the node 341B during the powering-up, irrespective of whether P-channel transistors or N-channel transistors may be switched into the conductive states due to device asymmetries during the power-up sequence, as long as a sufficiently pronounced difference of threshold voltages with respect to $V_{SS}$ is provided.

FIG. 3B schematically illustrates a circuit diagram of the storage cell 300 which may have basically the same configuration as the storage cell of FIG. 3A except for the fact that at least the storage elements 330A, 330B and the corresponding complementary transistor elements 310A, 310B forming the respective inverter structures have a P-channel configuration. Consequently, the respective second transistors 320A, 320B connected to the variable high supply voltage may be provided in the form of P-channel transistors. With respect to the functional behavior of the storage cell 300 of FIG. 3B, the same criteria may apply as previously discussed except for a respective inversion of the conductivity type of the associated transistor elements and the corresponding supply and control voltages.

Figures 3C, 3D:
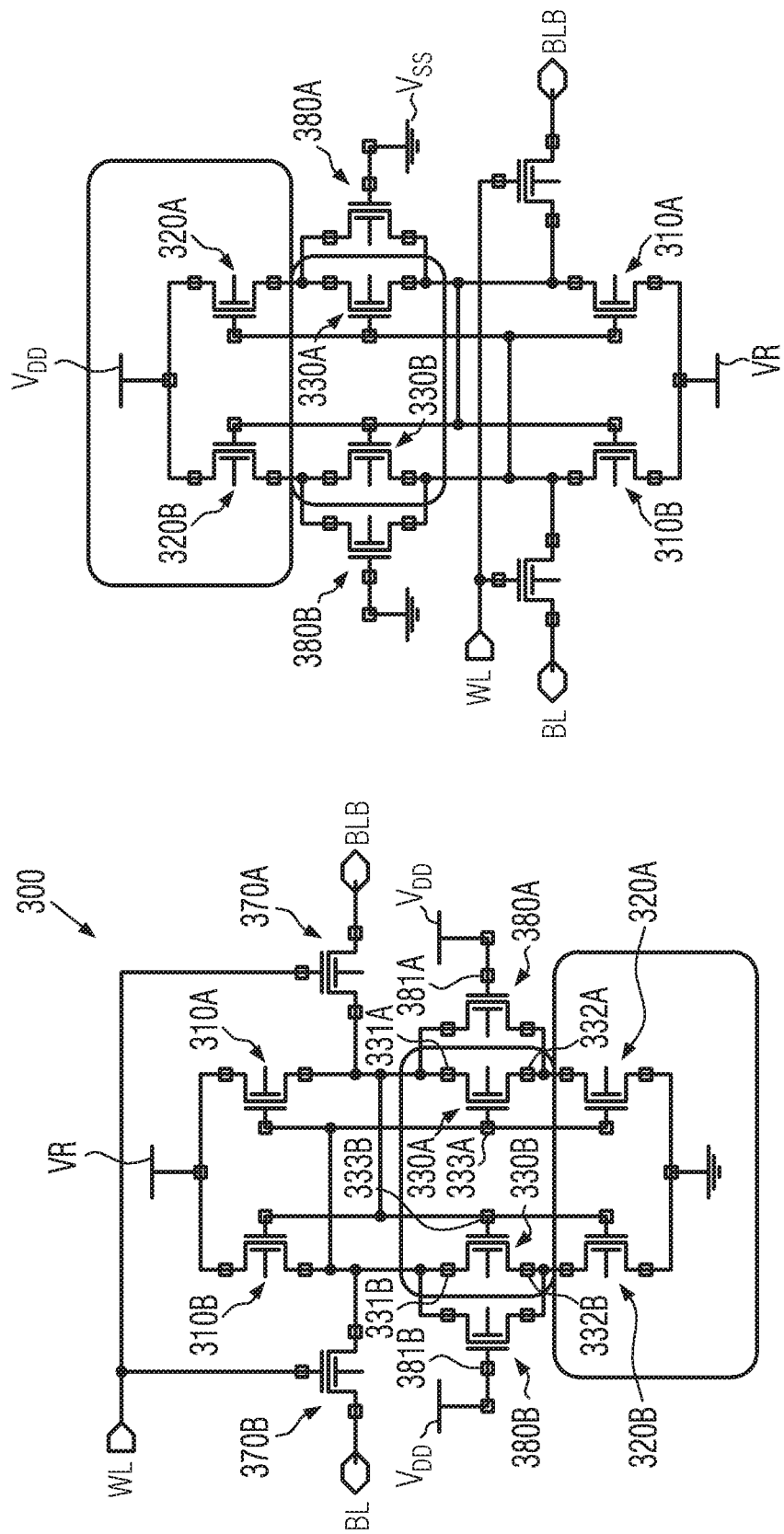
FIGS. 3C and 3D schematically illustrate circuit diagrams of a storage cell with non-volatile storage capability in N-channel configuration and P-channel configuration of the non-volatile storage element, respectively, with additional switching elements for bridging the non-volatile storage elements in certain operating phases, according to illustrative embodiments.

FIG. 3C schematically illustrates a circuit diagram of the storage cell 300 according to further illustrative embodiments, in which basically the same configuration is used as in FIG. 3A, wherein additionally respective switching elements 380A, 380B are provided so as to "short" the corresponding storage elements 330A, 330B, respectively. As already discussed in the context of FIG. 1C, the provision of the switching elements 380A, 380B may provide superior conditions during the write operation or programming operation of the respective storage elements 330A, 330B by ensuring that substantially the same potential is present at each of respective terminals 331A, 332A and 331B, 332B, respectively, as also discussed in the context of the first and second terminals 131, 132 shown in FIG. 1C.

In the embodiment shown, the switching elements 380A, 380B may be provided in the form of P-channel transistors, wherein respective gate terminals 381A, 381B are connected to the standard operating voltage $V_{DD}$. That is, during the normal operation with an operating voltage $VR=V_{DD}$ that avoids any non-volatile write operation in the storage elements 330A, 330B, the switching elements 380A, 380B are in their non-conductive state, thereby substantially not affecting the operation of the respective storage elements 330A, 330B. On the other hand, increasing the voltage difference between the operating voltage VR connected to the first transistors 310A, 310B and $V_{SS}$ may result in a corresponding voltage difference between the $V_{DD}$ applied to the gate terminals 381A, 381B of the switching elements 380A, 380B and VR, thereby switching these elements into the conductive state. Consequently, substantially the same potential may be present at the terminals 331A, 332A of the storage element 330A on the one hand, and the complementary potential may be present at both terminals 331B, 332B in the storage element 330B on the other hand. Consequently, upon receiving the respective control voltages at the control terminals 333A, 333B, the corresponding reconfiguration of the storage medium, such as the ferroelectric material, may be accomplished in an even more reliable manner.

FIG. 3D schematically illustrates a circuit diagram of the storage cell 300 according to a further illustrative embodiment, in which a P-channel configuration may be used for the storage elements 330A, 330B. Consequently, the respective transistors 310A, 310B may be provided as N-channel transistors and may connect to the reference voltage of VR that may be considered as a low supply voltage during the normal operating phase of the storage cell 300, and which may be lowered during a write operation of the storage elements 330A, 330B. Similarly, the transistors 320A, 320B may thus be provided in the form of P-channel transistor elements in order to connect the storage elements 330A, 330B to the high supply voltage $V_{DD}$ or disconnect the storage elements from $V_{DD}$. Moreover, the switching elements 380A, 380B may be provided in the form of N-channel transistors with the gate terminals thereof connected to the low supply voltage $V_{SS}$.

As a consequence, upon operating the storage cell 300 on the basis of a "normal" voltage difference between $V_{DD}$ and VR that may thus substantially correspond to $V_{SS}$, the standard static RAM-like operation may be achieved. Upon lowering the voltage VR below $V_{SS}$ in a sufficient degree so as to switch the respective transistors 380A, 380B into the conductive state, the corresponding storage elements 330A, 330B may be bridged, thereby providing superior write conditions, as also discussed above. As a consequence, during a specified operating phase, for instance, during a powering-down of the storage cell 300, the corresponding complementary logic states may be transferred into the respective storage elements 330A, 330B upon establishing the required increased voltage difference between $V_{DD}$ and VR, and these complementary logic states may be restored upon performing a power-up sequence, as also discussed above.

FIG. 3E schematically illustrates a circuit diagram of a further illustrative embodiment of the storage cell 300, which may have basically the same configuration as the storage cell 300 of FIG. 3C except for a different connection of the control terminals or gate terminals 381A, 381B of the respective switching elements 380A, 380B. In the embodiment shown, the gate terminal 381A of the switching element 380A may be connected to an input terminal 342A of the inverter structure formed by the transistor element 310A and the non-volatile storage element 330A, as also previously discussed. Similarly, the gate terminal 381B of the switching element 380B may be connected to an input node 342B of an inverter structure formed by the transistor 310B and the non-volatile storage element 330B, as also discussed above. As a consequence, when the voltage VR is raised so as to correspond to the required voltage difference for performing a write operation in the non-volatile storage elements 330A, 330B, the respective switching elements 380A, 380B may switch into the conductive or non-conductive state, depending on the corresponding logical state that is present at the input node 342A, 342B, respectively. For example, assuming a low voltage state at the input node 342A, the switching element 380A will be in its conductive state, thereby bridging the storage element 330A in order to more reliably convert the low voltage state into a corresponding configuration of the storage medium, as discussed above. On the other hand, if the input node 342A is in the high voltage state, the switching element 380A may remain in its non-conductive state, which, however, may not negatively affect the operation of the storage element 330A, since, in this case, the storage element 330A, together with the transistor element 320A, may be in their conductive state, thereby obtaining substantially zero or very low voltage drop across the storage element 330A. Consequently, also in this case, i.e., the case of a non-conductive switching element 380A, precisely defined voltage conditions may be obtained across the storage element 330A in order to reliably initiate a non-volatile write operation.

Similarly, reliable write conditions may be established on the basis of the switching element 380B for the storage element 330B, wherein the respective complementary conditions may be established compared to the storage element 330A.

FIG. 3F schematically illustrates a circuit diagram of the storage cell 300 according to a further illustrative embodiment, which is equivalent to the arrangement of FIG. 3E except for the fact that the storage elements 330A, 330B are provided with a P-channel configuration and accordingly the further transistor elements, such as the transistors 310A, 310B, 320A, 320B are provided in a complementary configuration with respect to the transistors of the configuration as shown in FIG. 3E. Similarly, the switching elements 380A, 380B are provided as N-channel transistors, wherein the respective gate terminals 381A, 381B are connected to the corresponding input nodes 342A, 342B. As already discussed, the input node 342A is the input of a respective inverter structure formed by the transistor 310A and the non-volatile storage element 330A connected thereto, and the input node 342B represents the input of the inverter structure formed by the respective transistor 310B and the non-volatile storage element 330B connected thereto. With respect to the functional behavior of the storage cell 300, the same criteria apply as previously discussed with reference to the storage cell 300 of FIG. 3E.

It should be appreciated that, for the configurations as shown in FIGS. 3E and 3F, a single reference voltage VR and a corresponding low supply voltage $V_{SS}$ may suffice for operating the corresponding storage cells 300. That is, operation of these storage cells 300 may be accomplished on the basis of a desired relatively low voltage difference of, for example, 1-3 V between VR and $V_{SS}$, and when a corresponding write operation to the storage elements 330A, 330B may be required, for instance, during a powering-down of the corresponding device, VR may be increased so as to increase the voltage difference in order to comply with the write conditions of the storage elements 330A, 330B.

Figure 3G:
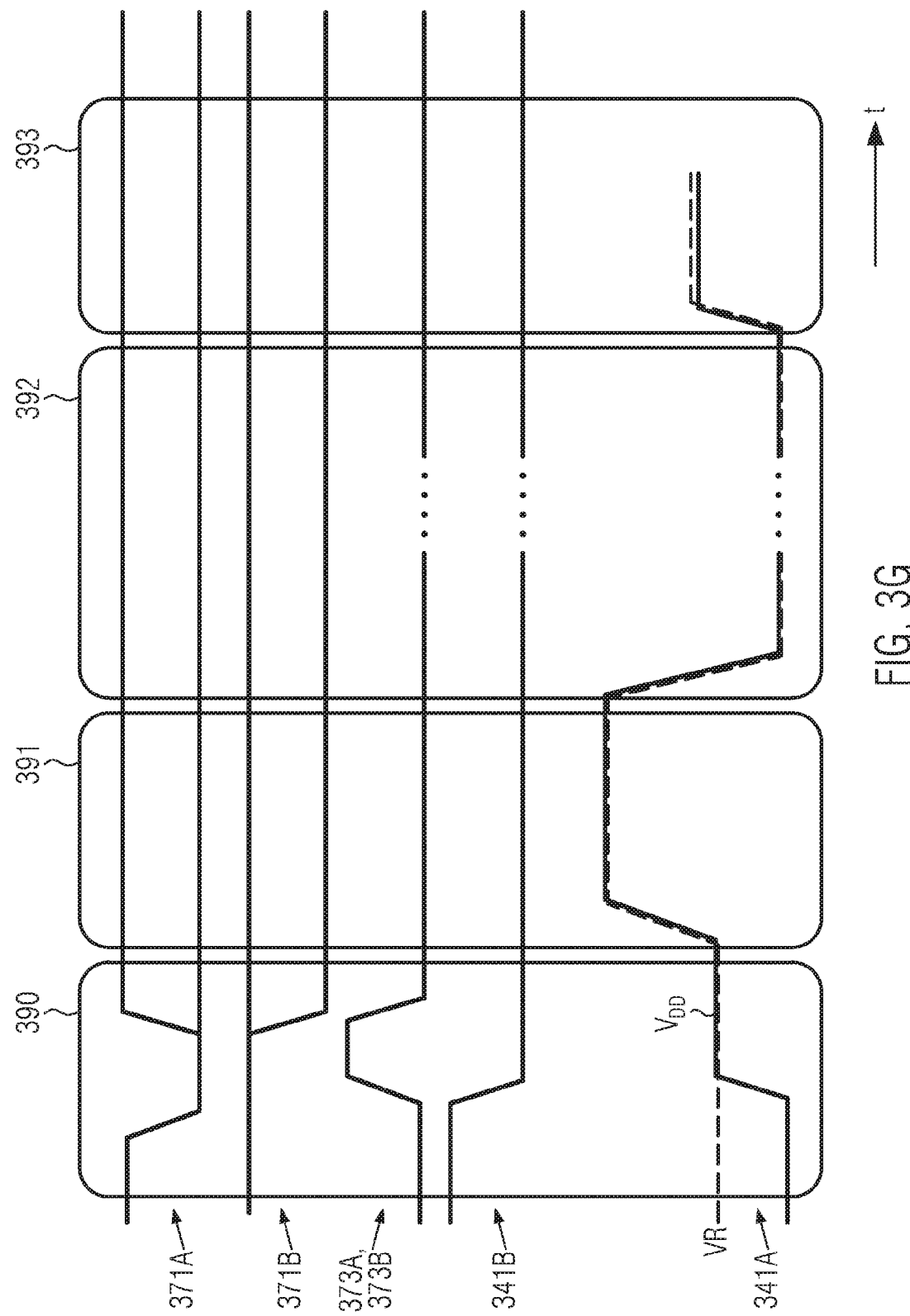
FIG. 3G schematically illustrates a timing diagram illustrating the operation of the storage cells of FIGS. 3A-3F for storing a logic state in a non-volatile manner and re-establishing the logic state upon powering-up the storage cell, according to illustrative embodiments.

FIG. 3G schematically illustrates a timing diagram in order to illustrate the operations performed in a storage cell according to illustrative embodiments of the present disclosure. In the example shown, reference is made to one of the storage cells 300, for instance, to the storage cell 300 of FIG. 3A. As usual, time t is plotted along the horizontal direction, while the signal amplitude at the various circuit nodes is plotted along the vertical direction.

As shown, a first time slot 390 corresponds to a standard operational behavior, which may be illustrated on the basis of a standard static RAM-like write operation. To this end, at the input 371A of the pass gate 370A, a desired signal level may be applied, for instance, a low level signal. On the other hand, a complementary signal may be applied at the input 371B of the complementary pass gate 370B. Consequently, when the corresponding signal levels at the inputs 371A, 371B are to be entered into the storage cell 300, control signals at the control terminals 373A, 373B may be ascertained, i.e., set into a high voltage level, thereby forcing the respective input levels into the storage cell 300. Consequently, the output node 341B may assume a low voltage level, while the complementary output node 341A may assume a high voltage level, which may be reliably maintained after deactivating the respective pass gates 370A, 370B, for instance upon resetting the control signals at the control terminals 373A, 373B. In this stage, i.e., VR corresponds to "standard" $V_{DD}$, the corresponding logic states may be readily read out from the storage cell 300 in accordance with operations as already discussed above.

It may now be assumed that a power-down sequence is to be performed, so that, in a timeslot 391, a non-volatile write operation may be performed. That is, prior to a corresponding ramping down of the supply voltages, the reference voltage VR, which may be held at a level $V_{DD}$ during the normal operation, as for instance discussed in the context of the timeslot 390, may be raised to an appropriate level so as to obtain the required voltage difference in order to initiate the non-volatile storage operation. Consequently, during the timeslot 391, the storage elements 330A, 330B are reconfigured in accordance with the corresponding logic states present at the output nodes 341A, 341B, respectively, as already discussed above. As a consequence, during a subsequent timeslot 392, in which effectively the voltage VR is a ramped down to 0 ($V_{SS}$), the corresponding states are preserved in a non-volatile manner in the respective storage elements 330A, 330B.

Thereafter, at any time, a power-up process may be performed, for instance, by simply switching on the supply voltage, and, therefore, during a timeslot 393, the supply voltage, i.e., in this case the reference voltage VR, may ramp up, for instance, to the normal operating voltage $V_{DD}$, thereby restoring the previously stored logic states, as discussed above. As a consequence, by simply increasing the voltage difference between VR and $V_{SS}$, for instance, at a single voltage line, a non-volatile write operation may be initiated at any specific time, thereby "freezing" a specified logic state within the non-volatile storage element. The corresponding stored data may then be re-established upon a power-up event, thereby providing the possibility of starting the operation of an electronic device that includes the storage cell of the present disclosure in a well-defined initial state. In illustrative embodiments, the "frozen" states may correspond to the state at a power-down event of the electronic device including the storage cell of the present disclosure, thereby enabling the continuation of the operation for the storage cell and any electronic device associated therewith, for instance, a state machine, a flip-flop, a static RAM device, and the like, on the basis of the same state that has been prevailing immediately prior to the last power-down event.

It should be appreciated that the concept of the present disclosure, i.e., implementing a non-volatile storage capability in a storage structure that enables a restoring of a previously stored logical state during a power-up event, may be realized on the basis of discrete, i.e., non-integrated, circuit components, which may be electrically connected on the basis of any appropriate technique, for instance, in the form of a connection on printed circuit boards and the like. In other illustrative embodiments, the concept may be implemented in the form of a semiconductor device including a plurality of circuit components, such as transistor elements, storage elements, within a single semiconductor chip.

Figure 4:
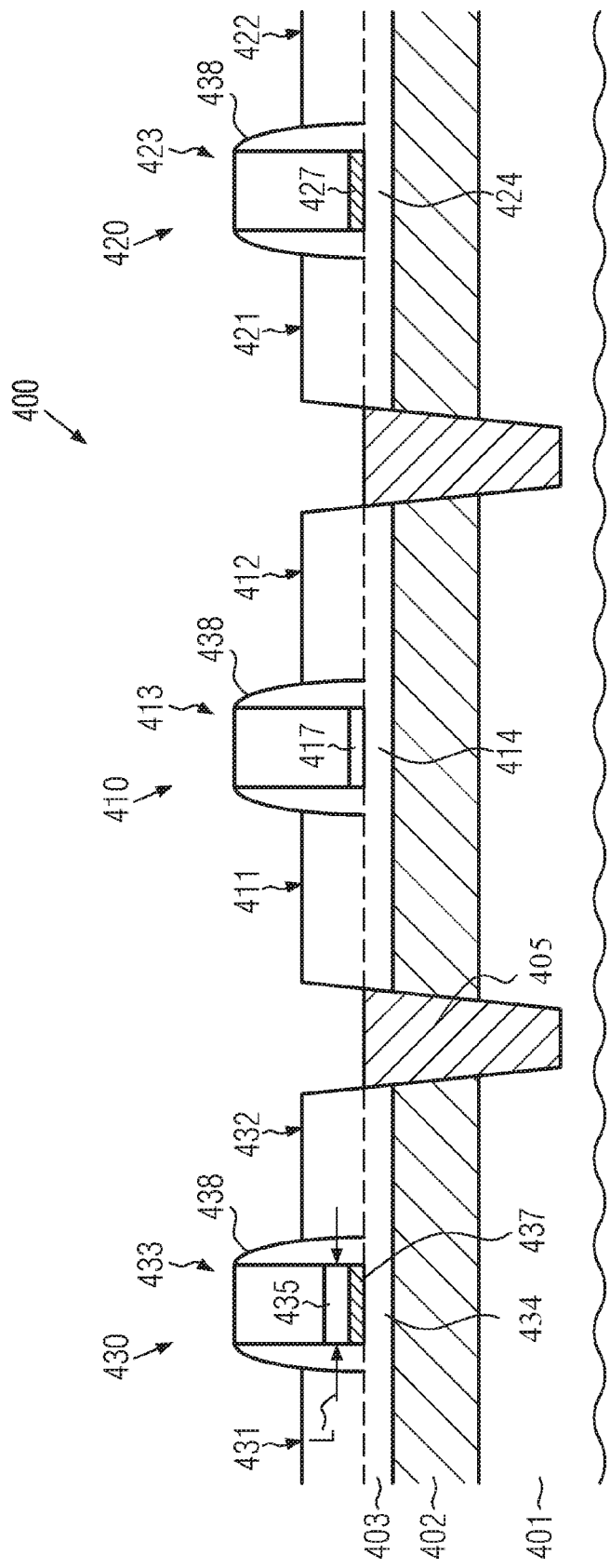
FIG. 4 schematically illustrates a cross-sectional view of a semiconductor device including respective transistor elements in the form of "regular" P-channel transistors and N-channel transistors in combination with a non-volatile storage element in the form of a ferroelectric transistor element, according to illustrative embodiments.

FIG. 4 schematically illustrates a cross-sectional view of a storage cell 400, which may have a similar electronic configuration as previously discussed in the context of the storage cells or storage structures 100 and 300 and the ferroelectric transistor elements 230. For convenience, only some components are illustrated in FIG. 4 so as to not unduly complicate the drawing.

As shown, the storage cell 400 may comprise first and second transistor elements 410, 420, which may be provided in the form of complementary transistors, i.e., the first transistor 410 may be provided as an N-channel transistor and the second transistor 420 may be provided as a P-channel transistor or vice versa. Furthermore, a storage element 430 may be provided, which may comprise or which may be provided in the form of a transistor element, wherein, in illustrative embodiments, the storage element 430 may be provided in a configuration that is highly compatible with the configuration and architecture of the first and second transistor elements 410, 420 and the respective manufacturing techniques. As discussed above, the first transistor element 410 and the storage element 430 may form an inverter structure and hence the first transistor element 410 and the storage element 430 may comprise or represent a complementary transistor pair.

The first and second transistor elements 410, 420 and the storage element 430 may comprise respective gate electrode structures 413, 423, 433, each of which may include a spacer element 438, for instance, formed of any appropriate material so as to provide a desired insulating and/or encapsulating effect. The respective gate electrode structures 433, 413, 423 may include any appropriate electrode material, such as doped polysilicon, metal-containing materials, doped germanium material, and the like, or any combination thereof, as may be required by the respective technology node under consideration. Moreover, in sophisticated applications, a length L of the respective gate electrode structures may comply with the corresponding technology node and may be in the range of 50 nm and significantly less, for instance 28 nm and less, depending on the overall device architecture. Moreover, the gate electrode structures 433, 413, 423 may include dielectric layers or layer systems 437, 417, 427, respectively, which may comprise "standard" dielectric materials, such as silicon dioxide, silicon nitride, silicon oxynitride and the like, possibly in combination with high-k dielectric materials, which are to be understood as materials having a dielectric constant of 10 and greater. For example, hafnium oxide-based materials and the like may be used in the context of gate dielectric layers in order to provide superior overall transistor performance. In particular, in sophisticated applications, high-k dielectric materials may be used in combination with metal-containing electrode materials in order to even further enhance overall transistor performance.

In illustrative embodiments, the gate dielectric materials of the various transistor elements operated in the same signal paths as and hence in functional combination with the storage element 430 are appropriately designed so as to withstand the voltages as required for performing write operations on the storage element 430, as discussed above. That is, typically, sophisticated transistors may be operated at relatively low supply voltages of approximately 1-3 V or even less, wherein, typically, the corresponding gate dielectric materials are adapted to this low voltage range. On the other hand, writing into the storage element 430 may require gate voltages in the range of up to 5 V and may, therefore, necessitate the implementation of a sufficiently electrically robust gate dielectric material, for instance, by providing a corresponding thickness of the gate dielectric material in order to enable a reliable operation of the transistors 410, 420 at voltages required for performing a write operation on the storage element 430. It should be appreciated that the same criteria also apply for any transistor elements which may have to be operated on the basis of an increased supply voltage upon operating the storage cell 400 in a write operation for storing a logic state in a non-volatile manner.

In the embodiment illustrated, the gate electrode structure 433 of the storage element 430 may comprise a storage medium, in one illustrative embodiment, in the form of a ferroelectric material 435 formed on and above the dielectric material 437, wherein, in some illustrative embodiments, a high degree of process compatibility may be achieved by using a ferroelectric material on the basis of hafnium oxide or any other material system, which may also be used in the context of the formation of regular transistors or which may at least be compatible with the corresponding manufacturing processes.

Moreover, respective drain and source regions 431, 432 may be provided in the element 430, drain and source regions 411, 412 may be provided in the transistor element 410 and drain and source regions 421, 422 may be provided in the transistor element 420. The corresponding drain and source regions in this embodiment are illustrated in a raised configuration and represent highly doped semiconductor regions of N-conductivity for N-channel transistors and P-conductivity for P-channel transistors. Moreover, respective channel regions 434, 414, 424 may be provided so as to comply with the overall transistor architecture.

For example, as also discussed above, in sophisticated applications, the transistor elements 410, 420 and also the storage element 430 may be provided in the form of fully depleted SOI transistor elements so that the corresponding channel regions are substantially non-doped semiconductor materials with a thickness of 10 nm and significantly less, for instance 8 nm and less. It should further be appreciated that the basic semiconductor material for different types of transistors may initially be prepared so as to enhance overall transistor performance, for instance, by providing a silicon/germanium mixture for some types of transistor elements. Consequently, the respective channel regions and the respective drain and source regions of the storage element 430 and the transistor elements 410, 420 may be formed on the basis of an initial very thin semiconductor layer as schematically indicated by 403 in FIG. 4. Moreover, a buried insulating layer 402, such as a buried silicon dioxide layer and the like, may be provided so as to obtain a desired SOI configuration. In other cases, when a bulk configuration is considered, the initial semiconductor layer 403 may be provided with an appropriate thickness, while a corresponding body region may be provided below the respective drain and source regions and the channel regions of the storage element 430 and the transistor elements 410, 420.

Furthermore, a substrate material 401, such as a silicon material, a germanium material and the like, may be used for forming thereon the various circuit elements in accordance with overall process requirements. Furthermore, specific device regions and complementary transistors may be separated by appropriate isolation structures 405, such as shallow trench isolations and the like.

The storage cell 400 as illustrated in FIG. 4 may be formed in accordance with process techniques used for forming sophisticated transistor elements, such as the transistors 410, 420, wherein, as discussed above, in particular, the gate dielectric layer or layer systems 417, 427 are formed so as to withstand the required write voltage of the storage cell 430. Thus, the gate electrode structures may be formed on the basis of sophisticated lithography techniques in order to obtain the required gate length L, wherein, prior to depositing one or more gate electrode materials, the gate dielectric material may be formed by oxidation, deposition and the like so as to meet the above-specified requirements with respect to breakthrough voltage. Furthermore, during and after the processes for forming the gate dielectric materials, the ferroelectric material 435 may be formed selectively in the gate electrode structure 433 so as to comply with the overall requirements of the storage element 430. For example, in illustrative embodiments, a thickness of the ferroelectric material 435 may be adjusted to a range of approximately 8-12 nm when using a silicon doped hafnium oxide material. In other cases, experiments or simulations or combinations thereof may be used to obtain a desired target thickness for the material 435 when considering other ferroelectric materials and/or different device architectures. It should be appreciated that the dielectric material 437 may be formed in the context of the formation of the gate dielectric layers 417, 427 and may have a thickness of approximately 1-1.5 nm, while, however, other values may be used, depending on the overall device configuration.

Prior to and/or after patterning the gate electrode structures, appropriate implantation processes may be performed, for instance, in the context of defining well regions and the like, in particular with respect to bulk configurations, followed by anneal processes, if required. Thereafter, the respective drain and source regions may be formed, for instance, by doping the respective semiconductor material adjacent to the channel regions 434, 414, 424 and/or by growing an in situ doped semiconductor material in order to obtain the raised drain and source configuration, as shown in FIG. 4. In some illustrative embodiments, extension regions (not shown) adjacent to the drain and source regions 431, 432 and connecting to the channel region 434 may be formed by ion implantation of arsenic ions by using an implantation energy of approximately 5 keV and a dose of approximately $10^{14}$ cm$^{-2}$ for an N-channel configuration of the storage element 430, thereby achieving superior long term operational stability of a desired range of write voltage, such as ±5 V.

The further processing may be continued by depositing metal-containing materials for obtaining highly conductive contact areas (not shown) in the gate electrode structures and the drain and source regions, followed by encapsulating the resulting structure in a dielectric material (not shown), which may subsequently be patterned so as to form contact openings to respective device areas, which may then be filled with appropriate metal-containing materials. Thereafter, one or more metallization layers (not shown) may be formed in order to electrically connect the various circuit elements in accordance with the overall device requirements.

As a result, the concepts discussed above may be efficiently implemented on the basis of existing semiconductor platforms and process techniques in order to establish a storage structure or storage cell having non-volatile storage capabilities at a single bit level. In an illustrative embodiment, a logic state may be stored at any desired point in time during operation of the storage structure, for instance, based on a ferroelectric transistor element, such as the transistor element 430, wherein restoring of the previously stored logic state may be accomplished during a power-up event without requiring any additional measures. In this manner, efficient state machines, flip-flops, static RAM areas, and the like may be provided so as to have non-volatile storage abilities on a single bit level, wherein storing of the single bit may be established on the basis of adjusting a write voltage at a single voltage node.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A static storage cell, comprising:
   a first inverter structure comprising a first transistor element and a non-volatile storage element, said first inverter structure comprising a first input and a first output;
   a switching element connected in parallel to said non-volatile storage element so as to enable controlled bridging of a first terminal and a second terminal of said non-volatile storage element;
   a second transistor element connected in series between said non-volatile storage element and a reference voltage; and
   a second inverter structure having a second input and a second output, said second output being connected to said first input and said second input being connected to said first output.

2. The static storage cell of claim 1, wherein said non-volatile storage element comprises a ferroelectric transistor element.

3. The static storage cell of claim 1, wherein said first transistor element is a P-channel transistor and said reference voltage is a low, in a relative sense, supply voltage.

4. The static storage cell of claim 1, wherein said first transistor element is an N-channel transistor and said reference voltage is a high, in a relative sense, supply voltage.

5. The static storage cell of claim 1, further comprising a pass gate connected to said first output and being configured to drive said first output temporarily into a desired logic state.

6. The static storage cell of claim 1, wherein said second inverter structure comprises a second non-volatile storage element.

7. The static storage cell of claim 6, further comprising a third transistor element connected in series between said second non-volatile storage element and said reference voltage.

8. The static storage cell of claim 7, further comprising a first data input/output connected to said first output and a second data input/output connected to said second output, wherein said first data input/output is logically inverse to said second data input/output.

9. The static storage cell of claim 7, further comprising a second switching element connected to said second non-volatile storage element in parallel so as to enable controlled bridging of a first terminal and a second terminal of said second non-volatile storage element.

10. The static storage cell of claim 1, wherein said switching element is a field effect transistor having a gate electrode that is connected to one of a high, in a relative sense, supply voltage and a low, in a relative sense, supply voltage when said reference voltage is the other one of said one of a high supply voltage and a low supply voltage.

11. The static storage cell of claim 1, wherein said switching element is a field effect transistor having a gate electrode that is connected to said input.

12. A one-bit storage structure, comprising:
   a first transistor element having a first gate terminal, a first drain terminal and a first source terminal, said first source terminal being connected to one of a low, in a relative sense, supply voltage and a high, in a relative sense, supply voltage;
   a second transistor element having a second gate terminal, a second drain terminal and a second source terminal, said second source terminal being connected to the other one of said one of a low supply voltage and a high supply voltage;
   a non-volatile storage element having at least a first terminal and a second terminal, said first terminal being connected to said first drain terminal of said first transistor element and said second terminal being connected to said second drain terminal of said second transistor element, said first terminal and said first drain terminal forming an output node; and a switching element connected in parallel to said non-volatile storage element so as to enable controlled bridging of said first terminal and said second terminal of said non-volatile storage element.

13. The one-bit storage structure of claim 12, wherein said non-volatile storage element is a ferroelectric transistor.

14. The one-bit storage structure of claim 13, wherein said first and second gate terminals are electrically connected with each other.

15. The one-bit storage structure of claim 12, further comprising an inverter structure connecting said output node with at least said first and second gate terminals.

16. The one-bit storage structure of claim 12, further comprising a parallel transistor element, wherein said parallel transistor element has a drain terminal connected to one of said first and second terminals of said non-volatile storage element and a source terminal connected to the other one of said first and second terminals of said non-volatile storage element.

17. A method, comprising:
providing a static storage cell so as to include a non-volatile storage element;
performing a power-up process by supplying a low, in a relative sense, supply power and a high, in a relative sense, supply power to said static storage cell;
during said power-up process, establishing a logic state of said static storage cell at an output node thereof on the basis of a state of said non-volatile storage element; and
storing a momentary logic state of said static storage cell provided at said output node in said non-volatile storage element by increasing a voltage difference between said low supply power and said high supply power so as to comply with one of a programming voltage and an erase voltage of said non-volatile storage element.

18. The method of claim 17, wherein increasing said voltage difference between said low supply power and said high supply power is performed at a power-down event of said static storage cell.

* * * * *